United States Patent [19]
Wallestad

[11] 3,939,973
[45] Feb. 24, 1976

[54] WAFER BASKET AND EASILY ATTACHED AND DETACHED CARRIER FOR SAME

[75] Inventor: Victor C. Wallestad, Edina, Minn.
[73] Assignee: Fluoroware, Inc., Chaska, Minn.
[22] Filed: Jan. 14, 1974
[21] Appl. No.: 433,121

[52] U.S. Cl. ............... 206/328; 16/114 R; 206/454; 220/94 R; 294/27 R
[51] Int. Cl.² ................... B65D 25/28; B65D 85/30
[58] Field of Search .......... 206/328, 329, 332, 455, 206/456, 449, 72, 454; 211/41 R; 220/94 R; 294/27 R, 33; 16/114 R, 114 B, 124

[56] References Cited
UNITED STATES PATENTS

| | | | |
|---|---|---|---|
| 1,904,988 | 4/1933 | Severance | 16/114 R |
| 1,973,568 | 9/1934 | Keith | 294/27 R |
| 2,312,256 | 2/1943 | Lumley | 294/27 R |
| 2,364,690 | 12/1944 | Rruner | 16/114 R |
| 2,725,143 | 11/1955 | Linebaugh et al. | 206/309 |
| 3,317,232 | 5/1967 | McFaul | 294/33 |
| 3,487,948 | 1/1970 | Haidegger | 211/41 R |
| 3,534,862 | 10/1970 | Shambelan | 206/332 |
| 3,861,733 | 1/1975 | Vander Mey | 220/94 R |

*Primary Examiner*—William T. Dixson, Jr.
*Attorney, Agent, or Firm*—James R. Haller; H. Dale Palmatier

[57] ABSTRACT

A wafer basket and a carrier easily attached and detached to an end wall of the basket. The wafer basket has upright side and end walls and an open top and bottom, with lower edges of at least two of the opposing walls having supports lying in a horizontal plane for resting the basket on a horizontal surface. At least one end wall has upper and lower edges which are adjacent the top and bottom of the basket, the lower edge being spaced above the horizontal plane. The carrier comprises a handle with a vertical plate at its lower end configured to lie against the one end wall of the basket. The lower edge of the plate has an upwardly and inwardly slanted lip configured to hook underneath the lower edge of the one end wall, and the plate also has an inwardly and downwardly oriented hook spaced above its lower edge and configured to hook over the upper edge of the basket end wall. The hook is of sufficient depth and is spaced vertically from the lower slanted lip so that when the hook is fully lowered over the upper edge of the one end wall, the lip may escape outwardly of that edge but when the lip is in contact with the lower edge of the basket wall, the wall is supportively retained between the hook and the lip. The carrier may thus be easily attached to and detached from the basket.

12 Claims, 5 Drawing Figures

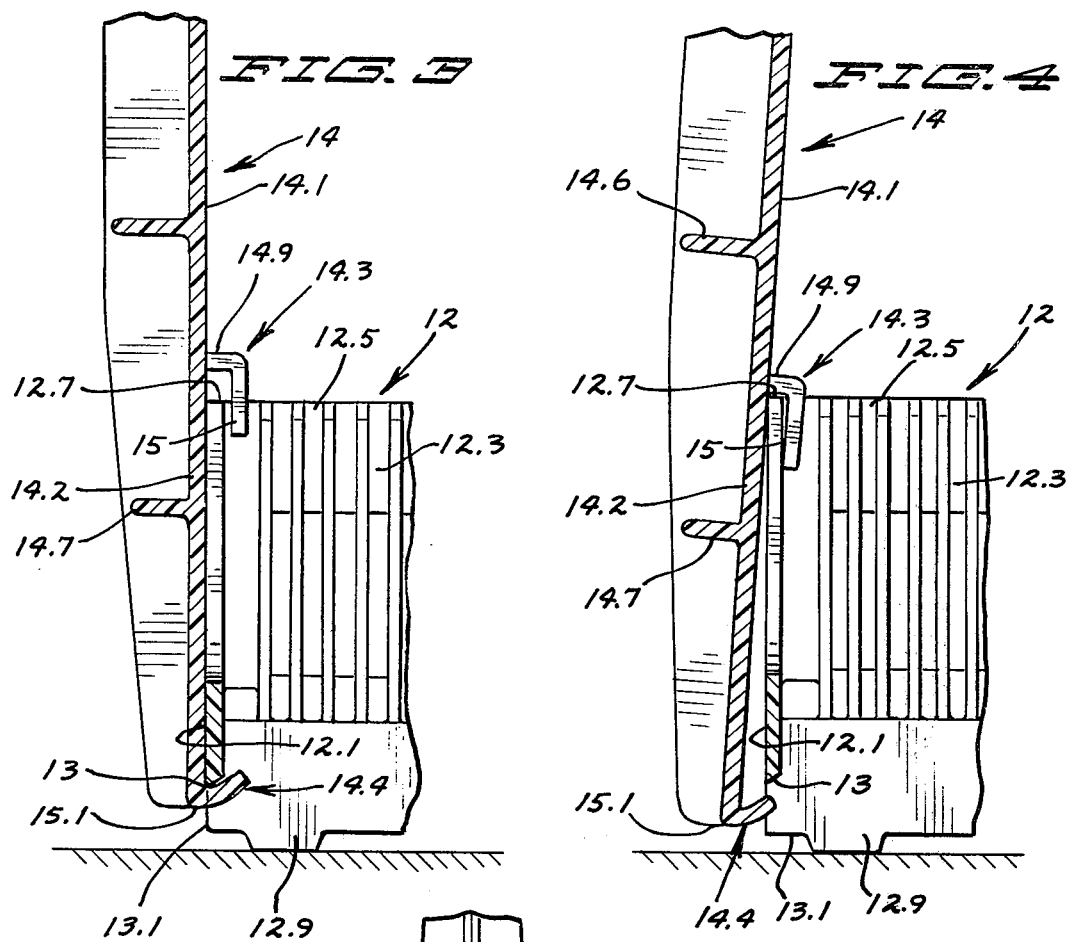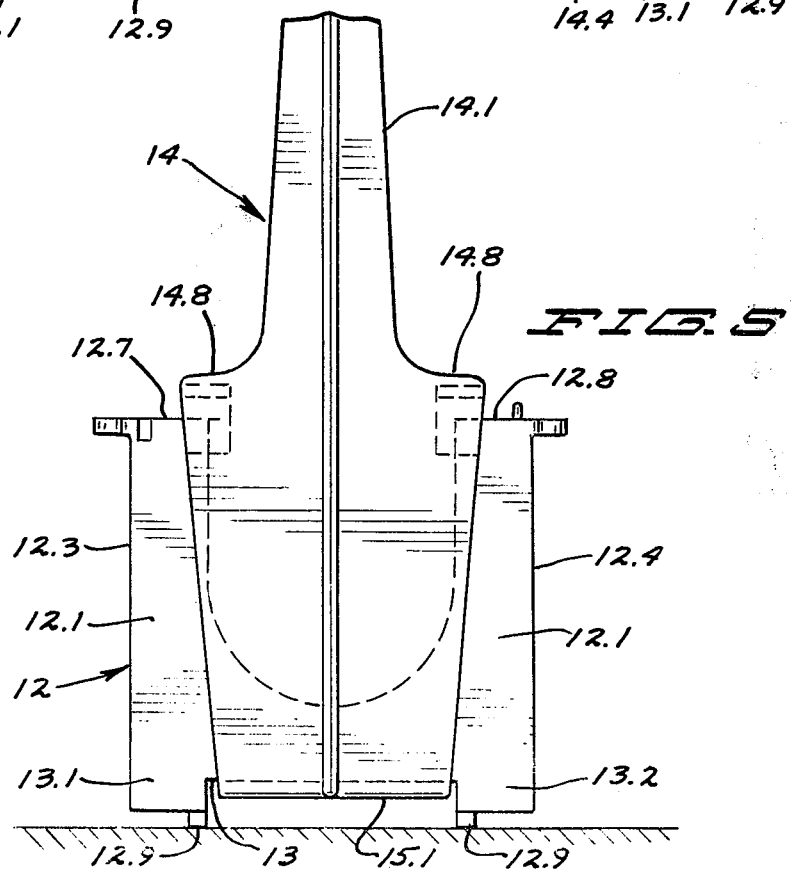

WAFER BASKET AND EASILY ATTACHED AND DETACHED CARRIER FOR SAME

BACKGROUND OF THE INVENTION

Silicone wafers which are used in semi-conductor technology often are contacted with corrosive chemicals during processing. The delicate wafers must be maintained scrupulously clean and must be supported against breakage, and for this purpose "wafer baskets" have been developed. Such baskets have side walls with opposed, vertical grooves between which the wafers are held in spaced, axially-aligned orientation. To avoid contamination and breakage which may occur when wafers are transferred from one basket to another, it is desired the wafers be retained within a single basket for as many processing steps as possible. Such processing steps may include immersion of a wafer basket with its spaced apart wafers into hot, corrosive chemical baths, and means must be provided for inserting wafer baskets into such baths and for later retriving the baskets without breakage or contamination of the wafers. Since the basket itself may be designed to fit various wafer processing machinery, as I have pointed out in my co-pending United States patent application, Ser. No. 378,686, filed July 12, 1973, it is often not feasible to permanently affix a handle or other carrier to such wafer baskets.

BRIEF SUMMARY OF THE INVENTION

The present invention relates to a wafer basket and an easily attached and detached carrier for the basket. The wafer basket has substantially vertical side and end walls and an open top and bottom, lower edges of at least two of the opposing walls having supports lying in a horizontal plane to support the basket on a horizontal surface. At least one of the end walls has upper and lower edges adjacent the top and bottom of the basket, the lower edge being spaced above the afore-mentioned horizontal plane. The carrier for the basket comprises a manually graspable handle having at its lower end a vertical plate configured to abut the one end wall of the basket. The plate has a lower edge with an upwardly and inwardly slanted projection or lip configured to hook beneath the lower edge of the one end wall, and an inwardly and downwardly oriented hook spaced above the lip and configured to hook over and capture the upper edge of the one end wall. The hook is of sufficient depth to permit the upper edge of the one wall to move vertically within the hook while preventing horizontal escape of that edge from the hook. The hook and lip are vertically spaced a sufficient distance to supportively retain between them the basket end wall when the lip is in contact with the lower edge of the one end wall but to permit the lip to escape outwardly of that lower edge when the hook is fully lowered upon the upper edge of the end wall, thereby permitting the carrier to be easily attached to and removed from the end wall of the basket.

BRIEF DESCRIPTION OF THE DRAWING

FIG. 3 is a broken-away side view, partially in cross section, taken along line 3—3 of FIG. 2 and showing the carrier attached to the basket;

FIG. 4 is a view in partial cross section and partially broken away of the basket and carrier of FIG. 3 showing the carrier partially disconnected from the basket; and FIG. 5 is a broken-away view of the basket and attached carrier of the invention.

PREFERRED DESCRIPTION OF THE PREFERRED EMBODIMENT

Figure 1:
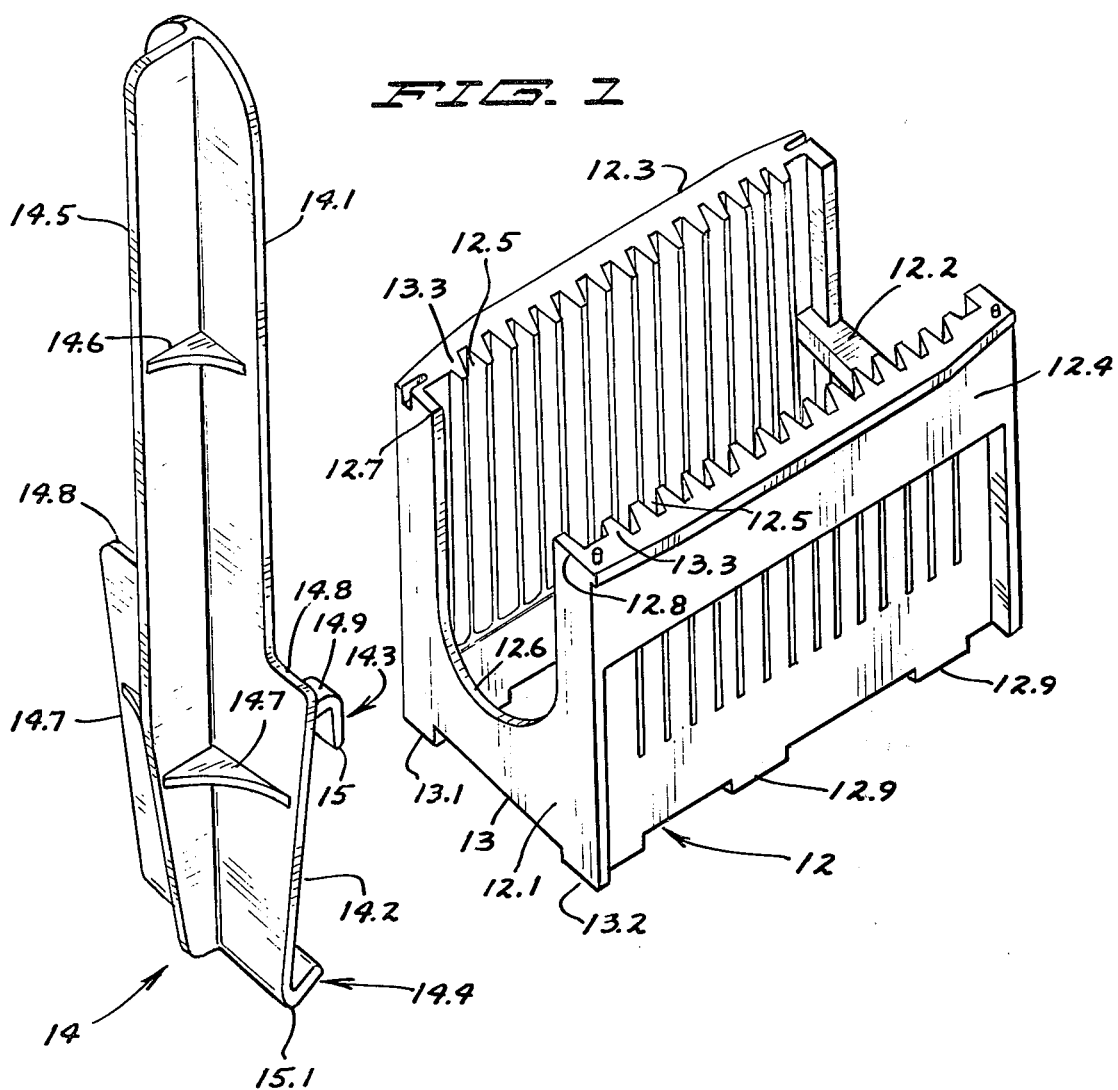
FIG. 1 is a perspective view of a wafer basket and carrier of the present invention.

Referring now to FIG. 1, the wafer basket and carrier of the present invention are designated generally as 12 and 14, respectively. The carrier is provided with an upper handle portion 14.1 and a lower vertical plate 14.2 which is adapted to abut one end wall 12.1 of the wafer basket. The handle is equipped with vertically spaced hooklike projections 14.3, 14.4 which hook respectively over and under the end wall 12.1, in a manner to be subsequently explained in greater detail. The wafer basket has an opposing end wall 12.2 which may take the form of a bar or strap connecting the side walls, and substantially vertical side walls 12.3, 12.4. Inner surfaces of the side walls are provided with confronting vertical grooves 12.5 between which wafers may be stored in spaced apart, axial orientation to one another. One such wafer is shown in dashed lines as 16 in FIG. 2.

The end wall 12.1 of the wafer basket has an upper edge with a centrally positioned, U-shaped depression 12.6 spaced inwardly of the junctions of the side walls with the end wall so as to leave upper edge sections 12.7, 12.8 adjacent the top of the basket. The U-shaped depression 12.6 permits endwise access to the wafers through the end wall 12.1. The upper edges 12.7 and 12.8 are bounded exteriorly by the respective side walls 12.3 and 12.4.

The side walls 12.3 and 12.4 of the wafer basket have downwardly oriented supports or leges 12.9, the bottom surfaces of which lie in a horizontal plane and which support the basket upon a horizontal surface such as the bottom surface of a chemical treatment tank or the like.

The end wall 12.1 of the basket has a lower edge 13 which is slanted upwardly and inwardly (FIGS. 3 and 4). the bottom edge terminating outwardly at its junctions with the sides in downwardly extending projections 13.1, 13.2. As shown best in FIG. 5, the last-named projections are spaced above the horizontal plane defined by the legs 12.9, but may, if desired, be extended downwardly to serve as additional supports for the basket. The slanted lower edge 13 is spaced above the horizontal plane defined by the legs 12.9, and the reason for this spacing will be subsequently explained in detail.

Figure 2:
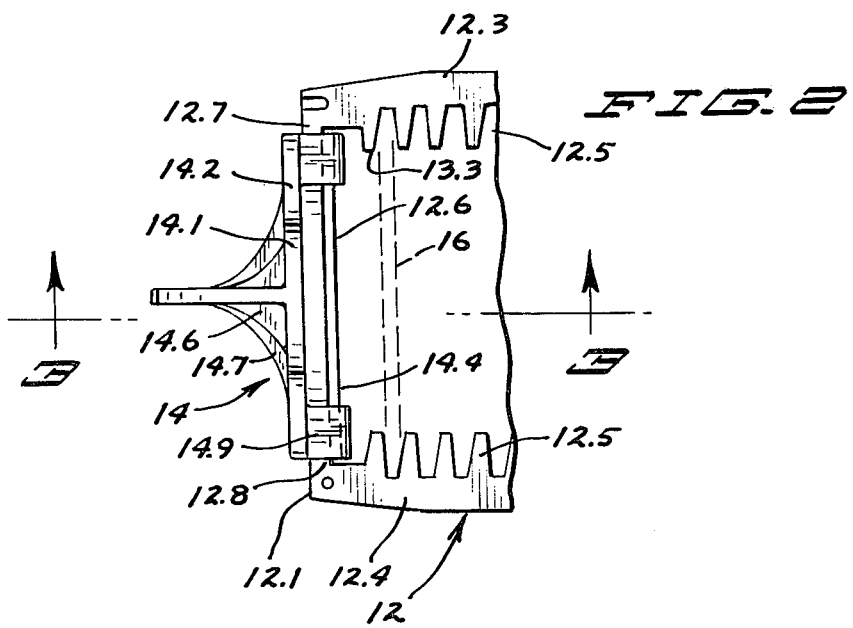
FIG. 2 is a broken-away top view of a wafer basket of the invention with the carrier attached.

As shown best in FIGS. 1 and 2, the upper edges 12.7 and 12.8 of the end wall 12.1, together with the respective side walls 12.3, 12.4 and the nearest wafer-contacting ridges 13.3 define opposed slots open at the top into which the respective hooks 14.3 of the carrier 14 are inserted.

The carrier 14 for the basket includes a generally vertical flattened rod having a vertical stiffening rib 14.5 along its rear surface and transverse stiffening webs 14.6, 14.7 joining the vertical rib to the flattened rod at points along the rod length, the transverse webs serving to stiffen the rod against twisting forces. The upper end of the flattened rod has converging edges defining a manually graspable handle, and near the midpoint of the rod the edges flare outwardly to form shoulders 14.8 (FIG. 5) and then converge slightly towards the bottom of the rod, the broadened lower section of rod thus defining a substantially vertical plate 14.2 having a front surface configured to abut and lie exteriorly against the outer surface of the end wall 12.1 of the basket. At its lower end the plate 14.2 has an upwardly and inwardly slanted, horizontally extending projection or lip 14.4 which is configured to engage the lower edge 13 of the basket and to fit between the downward projections 13.1, 13.2 of the end wall 12.1, the projections serving to restrain the lip from horizontal movement on the lower edge 13 of the end wall.

Mounted to the shoulders 14.8 of the vertical plate 14.2 are hooks designated generally as 14.3, the hooks having an inwardly directed, horizontal segment 14.9 and a vertical segment 15 extending downwardly from the end of the horizontal segments. The hooks are spaced apart so as to hook over the upper edges 12.7 and 12.8 of the basket end wall 12.1, the vertical hook sections 15 fitting within the slots formed by the respective end wall edges 12.7 and 12.8, the side walls 12.3 and 12.4, and the nearest wafer-contacting ridges 13.3 of the wafer basket. The upper edges 12.7 and 12.8 of the basket end wall thus are outwardly bounded by the side walls 12.3, 12.4, respectively, the side walls restraining the vertical hook sections 15 from escaping in a sidewards direction from the basket. The hooks are spaced apart a sufficient distance so that when the carrier 14 is attached to the basket, the hooks may move horizontally a small distance, and similarly, the width of the upwardly and inwardly slanted lip 14.4 is slightly less than the width of the lower edge 13 of the basket end wall between the downward projections 13.1 and 13.2. The small amount of slack thus provided prevents the carrier 14 from binding against the basket when it is attached to the basket, and the carrier can be easily attached to and detached from the basket with one hand and without touching the basket itself. The vertical sections 15 of the hooks 14.3 are spaced from the inner plate surface by a distance greater than the thickness of the upper edges 12.7, 12.8 of the basket end wall, thus permitting the carrier to tilt back and forth (FIG. 4) when the slanted lip 14.4 escapes from the lower edge 13 of the basket end wall.

The dimensional relationships between the basket and the carrier are important to enable proper operation of the present invention. Firstly, the internal vertical dimension of the vertical sections 15 of the hooks (which determines the depth of the hooks) must be greater than the internal vertical dimension of the upwardly and inwardly slanted lip 14.4. Secondly, the internal distance separating the horizontal sections 14.9 of the hooks from the lip 14.4 must be greater than the vertical distance separating the upper edges 12.7, 12.8 and the lower edge 13 of the end wall of the basket. Thirdly, the distance separating the interior surfaces of the horizontal sections 14.9 of the hooks from the bottom-most edge 15.1 of the carrier must be less than the distance between the upper edges 12.7, 12.8 of the end wall of the basket and the horizontal plane defined by the basket supports 12.9. That is, the upper and lower edges of the end wall 12.1 are spaced from the horizontal plane defined by the basket supports a sufficient distance to provide a space between the bottom-most edge 15.1 of the carrier and the horizontal plane when the upper edges of the end wall 12.1 are fully received within the hooks. With these dimension relationships, it will be seen that the upper edges 12.7, 12.8 of the end wall may ride vertically within the hooks 14.3 and yet be captively retained in the hooks.

With reference to FIG. 3, when the upwardly and inwardly slanted lip 14.4 of the carrier is in contact with the lower edge 13 of the basket end wall, the upper edges 12.7, 12.8 of the end wall are positively retained within the hooks 14.3. With reference to FIG. 4, when the carrier is lowered upon the end wall so that the upper edges 12.7, 12.8 are fully inserted within the hooks, the lip 14.3 of the carrier is spaced below the lower edge 13 of the end wall but the bottom edge 15.1 of the carrier is still spaced above the surface upon which the basket rests, and in this orientation the handle 14.1 of the carrier may be tilted inwardly to thus disengage the lip 14.4 from the basket.

In operation, to attach the carrier to the basket 12 the hooks 14.3 of the carrier are first hooked over the upper edges 12.7, 12.8 of the basket end wall, bringing the lower lip of the carrier into the position shown generally in FIG. 4. The handle 14.1 of the carrier is then moved outwardly, and then upwardly, the lip 14.4 capturing the lower edge 13 of the basket end wall and the upper edges, 12.7, 12.8 of the end wall remaining captured by the hooks 14.3. The process is reversed to disengage the carrier from the basket.

The vertical plate 14.2 of the carrier is desirably of sufficient width to prevent it from easily entering the U-shaped depression 12.6 in the end wall 12.1 of the basket. This feature reduces the possibility of contact between the carrier and wafers within the basket when the carrier is attached to or detached from the basket. The ease with which the carrier may be attached to or detached from the basket is particularly important when the basket is to be placed into or removed from a chemical treatment solution which affords low visability to the operator due to murkiness of the solution resulting from repeated use. In such instances the vertical plate 14.2 of the bundle may be advanced somewhat blindly toward the end wall 12.1 of the basket until contact between the carrier and basket is made, whereupon the carrier may be elevated slightly to permit the hooks 14.3 to slide over and capture the upper edges 12.7, 12.8 of the basket.

Because of the caustic chemicals and high temperatures which may be employed in the processing of silicone wafers, the basket and carrier desirably are of a chemical and heat resistant plastic such as "Teflon" PFA Fluorocarbon resin— a perfluoroalkoxy-substituted polytetrafluoroethylene-type resin sold by the DuPont Company.

Manifestly, I have provided a wafer basket and a carrier which may be easily attached to and detached from the basket and which positively supports the basket when attached thereto.

While I have described a preferred embodiment of my invention, it should be understood that various changes, adaptations, and modifications may be made therein without departing from the spirit of the invention and the scope of the appended claims.

What is claimed is:

1. In combination, a wafer basket and an easily attachable and detachable carrier for the basket, the wafer basket having substantially vertical side and end walls and an open top and bottom, lower edges of at least two opposing walls having supports lying in a horizontal plane to support the basket on a horizontal surface, an end wall of the basket having upper and lower edges adjacent the top and bottom of the basket with the lower edge spaced above the horizontal plane; the carrier comprising a handle having at its lower end a plate configured to abut the end wall of the basket, the plate having a lower edge with an upwardly and inwardly projecting lip configured to hook beneath the lower edge of the end wall, the plate further having a hook spaced above its lower edge and configured to hook over the upper edge of the end wall, the depth of the hook permitting the upper edge of the end wall to move vertically within the hook while restraining horizontal escape of that edge from the hook, the hook and upwardly and inwardly projecting lip being vertically spaced to supportively retain between them the basket end wall when the lip is in contact with the lower edge of that end wall, but having a vertical inner dimension between the hook and lip greater than the vertical dimension between the upper and lower edges of the end wall and permitting the lip to escape outwardly of the lower end wall edge when the upper edge of the end wall is fully inserted within the hook to permit the carrier to be easily attached to and detached from the basket when the basket is resting on a horizontal surface.

2. The wafer basket and carrier of claim 1 wherein the vertical plate of the carrier includes two horizontally spaced hooks configured to hook over outer ends of the upper edge of the basket end wall.

3. The wafer basket and carrier of claim 1 wherein the lower lip of the handle is upwardly slanted and wherein the lower edge of the end wall of the basket is slanted upwardly and inwardly of the basket to permit flush contact between it and the slanted lip of the carrier.

4. The wafer basket and carrier of claim 1 wherein the lower edge of the one end wall terminates at its junctions with the side walls in downwardly oriented projections confronting the lip of the carrier to restrain sideways movement of the lip when the latter is hooked under the lower edge of the end wall.

5. The wafer basket and carrier of claim 4 wherein the lower edge of the one end wall of the basket and the lower lip of the carrier are mutually configured to provide supportive contact therebetween across the majority of the side-to-side width of the end wall.

6. The wafer basket and carrier of claim 5 wherein the side-to-side width of the carrier lip is slightly less than the internal distance between the downwardly oriented projections at the lower edge of the one end wall of the basket.

7. The wafer basket and carrier of claim 2 wherein the upper edge of the one end wall over which the hooks of the carrier are hooked is bounded at each side by a side wall of the carrier, the side walls confronting the hooks and preventing sideways escape of the hooks from the end wall.

8. The wafer basket and carrier of claim 7 wherein the upper edge of the one end wall has a U-shaped depression spaced from its attachment to the side walls to enable endwise access to wafers within the basket, and wherein the vertical plate has a width dimension greater than the width dimension of the U-shaped depression to reduce possible accidental movement of the vertical plate into the wafer basket through the U-shaped depression during attachment or detachment of the carrier.

9. The wafer basket and carrier of claim 1 wherein the internal vertical distance separating the hook and lip of the carrier is greater than the vertical distance separating the upper and lower edges of the one end wall of the basket and wherein the hook has a vertical internal depth greater than that of the lip.

10. The wafer basket of claim 9 wherein the upper and lower edges of the one end wall of the basket are spaced from the horizontal plane defined by the basket feet a sufficient distance to provide a space between the carrier at its bottom-most edge and said plane when the upper edges of the basket end wall are received fully within the hooks.

11. In combination, a wafer basket and a carrier for the basket which may be easily attached to and detached from the carrier with one hand, the wafer basket having upright side and end walls and an open top and bottom, at least two opposing carrier walls having feet lying in a horizontal plane for supporting the basket on a horizontal surface, one end wall of the basket having upper and lower edges adjacent the top and bottom of the basket, the lower edge being spaced above the horizontal plane defined by the basket feet and having an upwardly and inwardly slanted surface bounded at its ends by downward projections, the upper edge of the end wall being bounded at its ends by the respective, confronting side walls; the carrier comprising a vertical, graspable handle having at its lower end a vertical plate configured to lie exteriorly against the one side wall of the basket, the plate having a lower edge with an upwardly and inwardly slanted lip configured to hook beneath the lower edge of the one end wall and to flushly encounter the slanted surface of the latter, the lip having a side-to-side width slightly less than the distance separating the downward projections of the lower edge of the end wall, the plate further having horizontally spaced, inwardly and downwardly oriented hooks spaced vertically above its lower edge and configured to hook over the upper edge of the one end wall adjacent the respective side walls, the hooks of the carrier having a vertical internal depth greater than that of the slanted lip and the hooks and lip being vertically spaced to permit vertical movement of the end wall between them, the relative vertical dimensions of the hooks, lip and side wall and the spacing of the side wall above the horizontal plane permitting supportive retention of the upper edge of the end wall within the hooks when the lower edge of the end wall is in contact with the slanted lip and permitting the slanted lip to escape freely outwardly of the lower edge of the end wall when the upper edge of that wall is fully received within the hooks, the horizontal distance separating outer edges of the hooks being slightly less than the horizontal distance separating the side walls at their junctions with the one end wall of the carrier.

12. An easily attachable and detachable carrier for a wafer basket, the latter having upright side and end walls and an open top and bottom, lower edges of at least two opposing basket walls having supports lying in a horizontal plane to support the basket on a horizontal surface, one end wall of the basket having upper and lower edges adjacent the top and bottom of the basket with the lower edge spaced above the horizontal plane;

said carrier comprising a handle having at its lower end a plate configured to engage and lie against the one end wall of the basket, the plate having a lower edge with an upwardly and inwardly projecting lip configured to hook beneath the lower edge of the one end wall, the plate further having a hook spaced above its lower edge and configured to hook over the upper edge of the end wall, the depth of the hook permitting the upper edge of the wall to move vertically within the hook while restraining horizontal escape of that edge from the hook, the hook and lip being vertically spaced to supportively retain between them the basket end wall when the lip is in contact with the lower edge of that end wall, but to permit the lip to escape outwardly of that lower edge when the upper edge of the end wall is fully inserted within the hook.

* * * * *